(12) United States Patent
Tanaka et al.

(10) Patent No.: US 8,692,355 B2
(45) Date of Patent: Apr. 8, 2014

(54) MINUTE CAPACITANCE ELEMENT AND SEMICONDUCTOR DEVICE USING THE SAME

(75) Inventors: Daisuke Tanaka, Tokyo (JP); Hiroyoshi Ichikura, Ibaragi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 321 days.

(21) Appl. No.: 12/958,478

(22) Filed: Dec. 2, 2010

(65) Prior Publication Data
US 2011/0148516 A1    Jun. 23, 2011

(30) Foreign Application Priority Data
Dec. 22, 2009   (JP) ................. 2009-290705

(51) Int. Cl.
*H01L 25/00* (2006.01)
(52) U.S. Cl.
USPC ............. 257/532; 257/307; 257/E29.342; 257/E29.343
(58) Field of Classification Search
USPC .......... 257/E21.664, E27.104, 288, 296, 306, 257/307, E29.325, E29.342, E29.343, 532; 365/145; 327/564; 361/301.1
See application file for complete search history.

(56) References Cited

U.S. PATENT DOCUMENTS

| 6,777,775 B2 | 8/2004 | Miyada et al. |
| 8,217,493 B2 | 7/2012 | Inoue et al. |
| 2005/0248975 A1 * | 11/2005 | Ozaki ................... 365/145 |

FOREIGN PATENT DOCUMENTS

| JP | 04306818 A | * 10/1992 |
| JP | 05-094159 | 4/1993 |
| JP | 05-235381 | 9/1993 |
| JP | 10-116981 | 5/1998 |
| JP | 2003-017575 A | 1/2003 |
| JP | 2006-237127 | 9/2006 |
| JP | 2006237127 A | * 9/2006 |
| JP | 2007-081044 | 3/2007 |
| WO | 2009001695 A1 | 12/2008 |

OTHER PUBLICATIONS

Notice of Rejection dated Oct. 29, 2013.

* cited by examiner

*Primary Examiner* — Ermias Woldegeorgis
(74) *Attorney, Agent, or Firm* — Volentine & Whitt, PLC

(57) ABSTRACT

A minute capacitance element has a high accuracy capacitance and is resistant to external noises. The minute capacitance element includes: first and second metal electrodes having respective opposite facets facing each other formed on an insulator layer to define a first gap therebetween; and a shield electrode being connectable to an externally applied potential and formed on the insulator layer within the first gap to define a slit confining a synthetic capacitance.

18 Claims, 10 Drawing Sheets

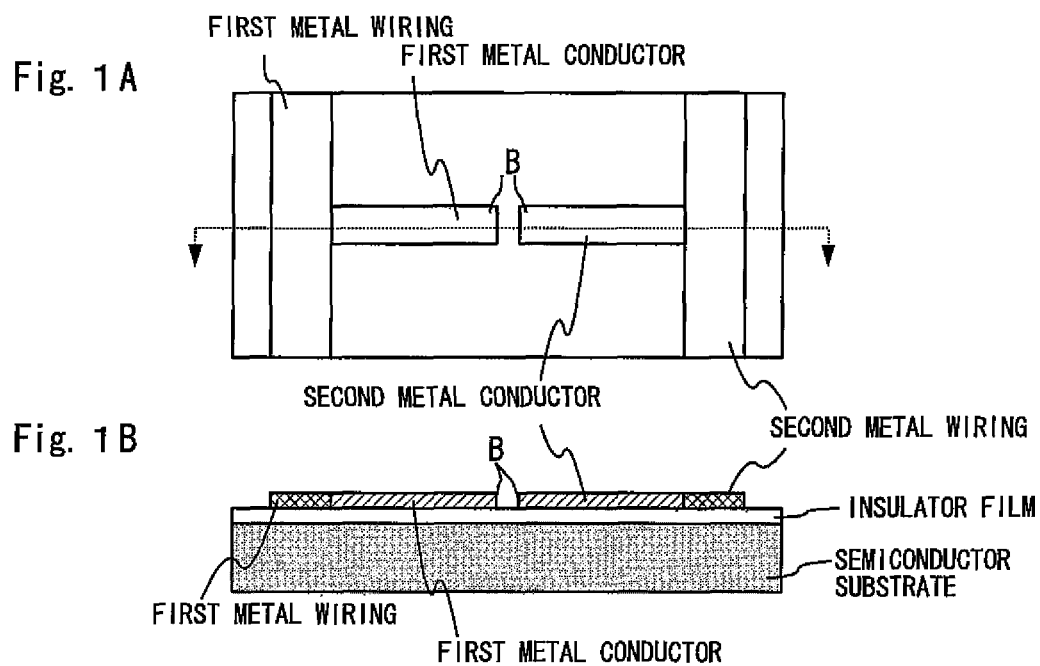
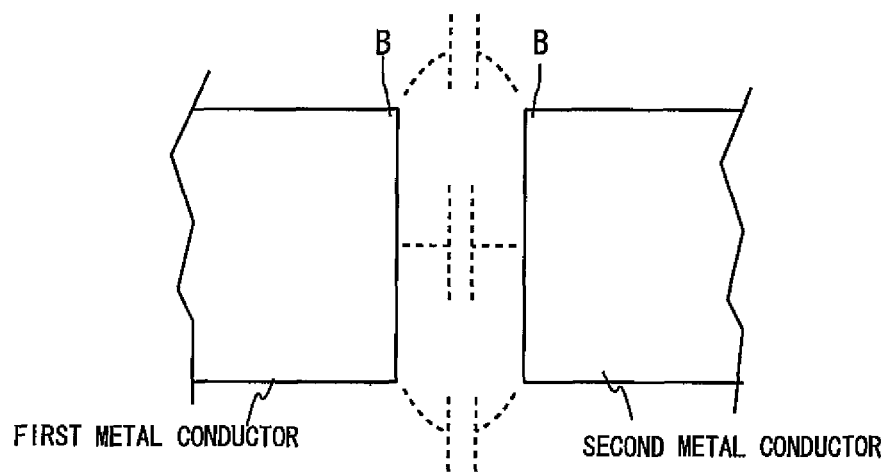

MINUTE CAPACITANCE ELEMENT AND SEMICONDUCTOR DEVICE USING THE SAME

BACKGROUND OF THE INVENTION

1. Field of the Invention

The present invention relates to a minute capacitance element with a minute capacitance and, more specifically, to a large scale integrated circuit semiconductor device (LSI) using the minute capacitance element to be usable for a digital/analog (D/A) conversion, analog/digital (A/D) conversion or the like.

2. Description of the Related Art

In recent years, there is a demand for a High Definition liquid crystal display (HDLCD) as a display device with 1,920×1,080 pixels or more. As to the HDLCD, there is also a demand for a gray scale displaying or the like of a high gray scale e.g., colors of thousand millions higher than a conventional 8-bit gray scale. Therefore it is requested that a HDLCD driver of semiconductor device for driving the HDLCD is advanced of functional performance.

The HDLCD driver is required to have a D/A conversion circuit with a high-speed and high-performance capable of a multi-bit processing, since digital video signals input thereto are subject to the D/A conversion.

The D/A conversion circuit mainly comprises an amplifier circuit and a resistive DAC (i.e., resister type Digital to Analog Converter using an array of the resistance elements) or capacitive DAC (i.e., capacitor type Digital to Analog Converter using an array of the capacitance elements) or combination thereof. In the D/A conversion circuit, the resistive DAC or capacitive DAC mainly determines an accuracy of output and a device size. It is important how to control an area of the resistive DAC or capacitance DAC to be small, while keeping the accuracy of output of the D/A conversion circuit. In addition, there are many problems in cross-over capacitances, dielectric materials or the like for the circuit designing since those components are made densely as thin film resistance elements, so that the interlayer circuit designing is complicated frequently. Thus, the capacitive DAC is used widely.

The designing and formation of a high accuracy D/A conversion circuit are requested in order to manufacture HDLCD driver LSIs. Thus the array of the capacitance elements is provided for adjustment of the capacitive DAC. Further, a capacitance element having a capacitance value of from several tens atto-farads to several femto-farads is called as a minute capacitance element hereinafter, but the capacitance of the minute capacitance element is not limited to such a capacitance value.

Whereas, there is known conventionally an interdigital capacitor as a capacitance element of the capacitive DAC (See Japanese Patent Application Publication No. 5-235381) so that two comb-like conductor electrodes are formed on the same insulator film in such a manner that respective electrode fingers of the both electrodes are alternately arranged The interdigital capacitor is suitable for formation of the capacitance element having several tens atto-farads to several femto-farads with a high accuracy formed on the same insulator film.

Furthermore, there is a propose configuration for a capacitance element with a small capacitance value, as shown in FIGS. 1A and 1B, which comprises the first and second metal conductors connected respectively to the first and second metal wirings on the insulator film over the semiconductor substrate characterized in that the first and second metal conductors have leading ends B facing each other to be a capacitor with a wide width thereof (See Japanese Patent Application Publication No. 2006-237127). Further, FIG. 1A shows a schematic partial plane view of the capacitance element and, FIG. 1B shows a cross-section view taken along a broken line endpoint arrow line of FIG. 1A.

In the conventional minute capacitance element, as shown in FIG. 2, there exist fringing capacitances (broken lines) between the edges of the opposite facets of leading ends B other than the opposite facets of rectangular leading ends B facing each other of the first and second metal conductors. The fringing capacitances exert an influence on the increase of capacitance as a problem.

In addition, as shown in FIG. 3, the conventional minute capacitance element may have electrodes whose the leading ends B are rounded and dependent on the finishing of process although to be a rectangle shape, so that the capacitance value thereof is apt to be inconstant as a problem.

In other words, the conventional minute capacitance element has a problem that the fringing capacitances about the opposite facets of the metal conductors and the evenness of the leading ends' shape exert an influence on the capacitance of the device.

SUMMARY OF THE INVENTION

Therefore, the present invention has been made in view of the foregoing problems, and it is an object of the present invention to provide a minute capacitance element with a high accuracy of capacitance, and the layout configuration thereof, and a D/A conversion or A/D conversion circuit using the same, and a semiconductor device having an adjusting circuit therefor.

According to the present invention, there is provided a minute capacitance element comprising: an insulator layer; a pair of first and second metal electrodes having respective opposite facets facing each other formed on the insulator layer to define a first gap therebetween; and a shield electrode being connectable to an externally applied potential and formed on the insulator layer within the first gap to define a slit confining a synthetic capacitance (i.e., synthetic capacitance confining slit).

The foregoing minute capacitance element may further comprises: a first shield layer layered under the insulator layer; a second insulator layer formed on the first and second metal electrodes and the shield electrode; and a second shield layer covering the first and second metal electrodes and the shield electrode via the second insulator layer. In the foregoing minute capacitance element, at least one of the first and second metal electrodes may comprise a projecting portion having the opposite facet and extending perpendicularly from a base portion extending longitudinally so that the opposite facet has an expanded area wider than a cross section of the base portion in the perpendicular direction. In the foregoing minute capacitance element, the opposite facets of the first and second metal electrodes may be rounded. In the foregoing minute capacitance element, two of the minute capacitance elements may be provided in proximity in a row arrangement so that one of the shield electrodes belongs to the two of the minute capacitance elements.

According to the present invention there is also provided a semiconductor device comprising: a minute capacitance element including an insulator layer; a pair of first and second metal electrodes having respective opposite facets facing each other formed on the insulator layer to define a first gap therebetween; and a shield electrode being connectable to an externally applied potential and formed on the insulator layer within the first gap to define a slit confining a synthetic capacitance; and an operational amplifier having positive and negative input terminals in a virtual short wherein a reference voltage to be input to one of the positive and negative input terminals is applied to the shield electrode.

The foregoing semiconductor device may further comprise: a first shield layer to which the reference voltage is applied and layered under the insulator layer; a second insulator layer formed on the first and second metal electrodes and the shield electrode; and a second shield layer to which the reference voltage is applied and covering the first and second metal electrodes and the shield electrode via the second insulator layer. Furthermore, the foregoing semiconductor device may further comprise a feedback capacitor fine adjustment circuit comprising: a feedback capacitor connected from the output terminal of the operational amplifier to the other of the positive and negative input terminals, wherein a plurality of the minute capacitance elements are connected in parallel to the feedback capacitor; and a switching device for controlling individually a plurality of the minute capacitance elements to be in an ON or OFF status thereof.

According to the present invention there is also provided an electrostatic capacitance element comprising: a pair of first and second metal electrodes formed on an insulator layer so as to be spaced out and facing each other to define a capacitance therebetween; and a pair of shield electrodes connected to a power source and formed between the first and second metal electrodes on the insulator layer so as to be spaced out and facing each other. In the foregoing electrostatic capacitance element, the first electrode may have a first opposite portion electrically connected to the first electrode and formed at a leading end thereof so as to extend perpendicularly from the first electrode to be opposite to the second electrode. In the foregoing electrostatic capacitance element, the second electrode may have a second opposite portion electrically connected to the second electrode and formed at a leading end thereof so as to extend perpendicularly from the second electrode to be opposite to the first electrode.

According to the present invention, there is also provided a first adjustment method for adjusting an output electrostatic capacitance value output from the foregoing electrostatic capacitance element, comprising the steps of: setting an electrostatic capacitance between the first electrode and the second electrode; and adjusting a distance between the pair of shield electrodes, whereby a capacitance value defined between the first electrode and the second electrode is regulated.

According to the present invention, there is also provided a second adjustment method for adjusting an output electrostatic capacitance value using first and second electrostatic capacitance elements, comprising the steps of: providing a first electrostatic capacitance element and a second electrostatic capacitance element connected to the first electrostatic capacitance element, wherein the second electrostatic capacitance element has been regulated by the foregoing first adjustment method; detecting an electrostatic capacitance value output by the first electrostatic capacitance element; and switching the second electrostatic capacitance element to regulate an electrostatic capacitance value output by a combination of the first electrostatic capacitance element and the second electrostatic capacitance element to a predetermined value of synthetic capacitance thereof.

According to the present invention, there are obtained a minute capacitance element with a high accuracy capacitance and being resistant to external noises and a semiconductor device the same.

BRIEF EXPLANATION OF THE DRAWINGS

The aforementioned aspects and other features of the invention are explained in the following description, taken in connection with the accompanying drawing figures wherein:

FIGS. 2 and 3 are partially enlarged plane views each showing a conventional capacitance element;

FIG. 12 is a schematic partial plane view showing an array of capacitors of another embodiment including an inverting amplifier circuit including a minute capacitance element according to the present invention;

FIG. 13 is a schematic partial cross section view showing a layout of another embodiment including an inverting amplifier circuit including a minute capacitance element according to the present invention;

DETAILED DESCRIPTION OF THE INVENTION

Exemplary embodiments according to the present invention will be described in detail below with reference to the accompanying drawings.

—Minute Capacitance Element—

Figure 3:
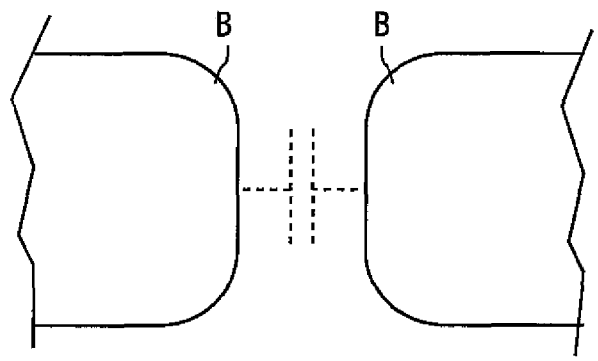
Figure 4:
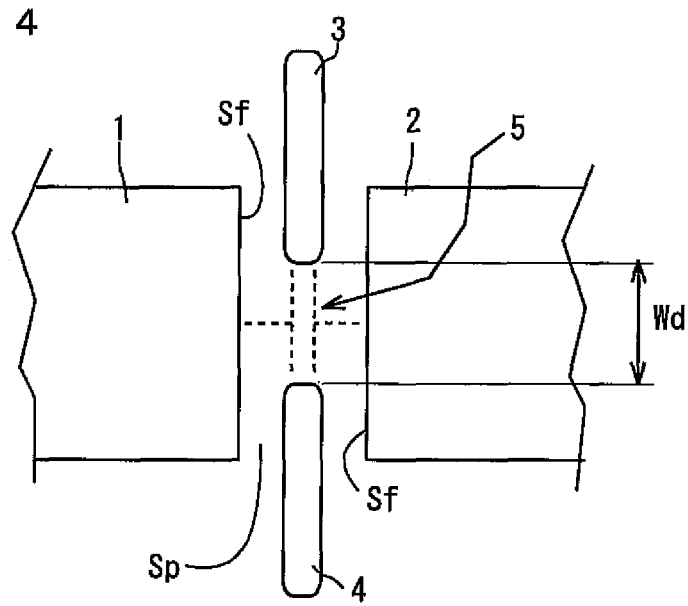
FIG. 4 is a partially enlarged plane view showing a minute capacitance element according to the present invention.
Figure 5:
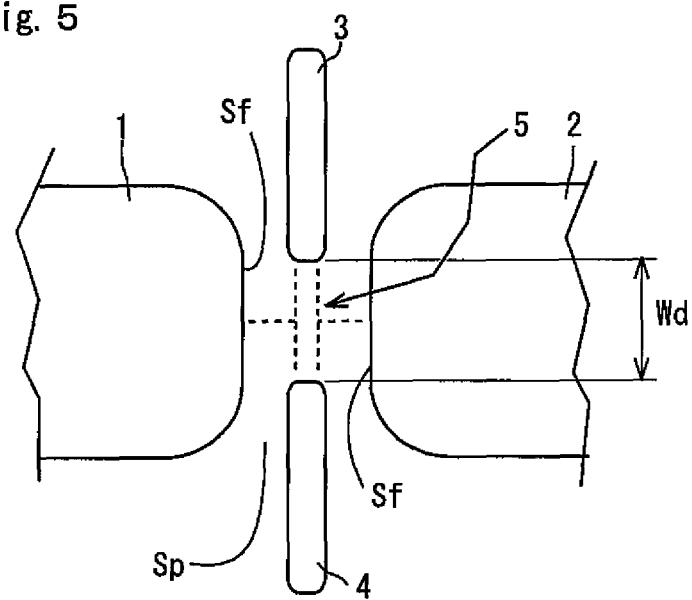
FIGS. 5 to 8 are partially enlarged plane views each showing another embodiment of a minute capacitance element according to the present invention.

FIGS. 4 and 5 show portions of minute capacitance elements with minute capacitance of embodiments according to the present invention.

As shown in the figures, the minute capacitance element includes a pair of metallic electrodes 1 and 2 opposite to each other are formed on the same layer of an insulator layer (not illustrated because it exists as this paper imaginary); and a pair of conductor strips made of metal or the like, that is, shield electrodes 3 and 4 interposed between the metallic electrodes. The shield electrodes are connectable to an externally applied potential.

A slit 5 is formed between the pair of opposite shield electrodes 3 and 4 interposed between the metallic electrodes in such a manner that a slit width Wd is constant even if the shield electrodes 3 and 4 are rounded. Further, the number of conductor strips is not limited two although the shield electrodes are a pair of conductor strips.

As described above, the first and second metal electrodes 1 and 2 of the minute capacitance element of the embodiment extend toward each other and opposite to each other so as to define a first gap Sp, so that the electrodes 1 and 2 have opposite facets Sf respectively. Further, the first and second wirings (not shown) are disposed on the insulator layer so that the first metal electrode 1 and the second metal electrode 2 are electrically connected thereto. Thus, the first and second wirings are formed on the insulator layer so as to keep a space separated more broadly than the first gap Sp. The pair of shield electrodes 3 and 4 is formed on the insulator layer so as to define the slit 5 within the first gap Sp and adjust or confine the synthetic capacitance between the opposite facets of the first and secondmetal electrodes 1 and 2.

In a first adjustment method for adjusting an output electrostatic capacitance value output from the electrostatic capacitance element, a step of setting an electrostatic capacitance between the first electrode and the second electrode; and a step of adjusting a distance between the pair of shield electrodes are performed, whereby a capacitance value defined between the first electrode and the second electrode is regulated.

As shown in FIG. 4, the minute capacitance element is formed so that the pair of electrodes 1 and 2 faces each other through the slit 5 of the shield electrodes 3 and 4. In case that a DC voltage is applied to the shield electrodes, there is no capacitance formed other than between the opposite facets Sf of the electrodes 1 and 2 seen through the slit 5 of the shield electrodes 3 and 4.

In addition, as shown in FIG. 5, even if the electrodes 1 and 2 are rounded by an influence in the process i.e., the corners of the opposite facets of the opposite electrodes 1 and 2 are curved, the distance between the pair of opposite electrodes (i.e., distance between the opposite facets Sf) and the area of the opposite facet Sf seen through the slit 5 are constant, so that there is no influence to the capacitance thereof.

Figure 6:
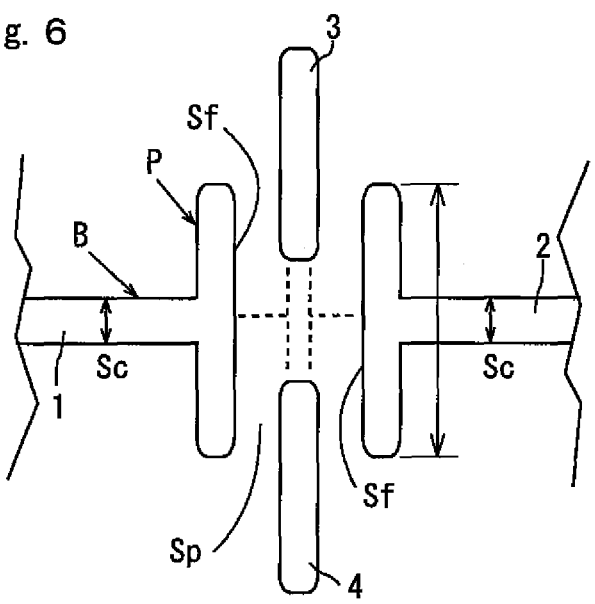
Figure 7:
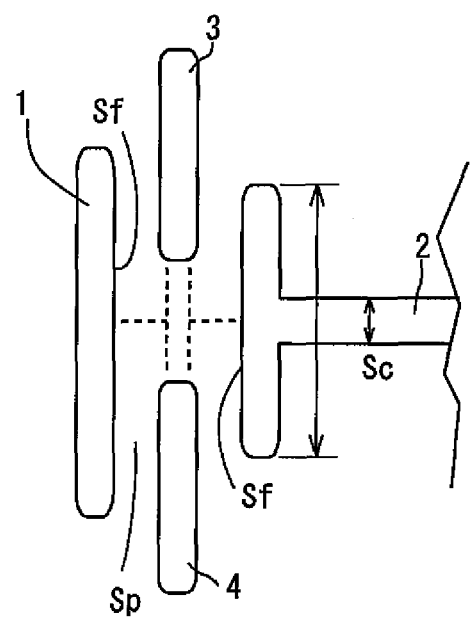
Figure 8:
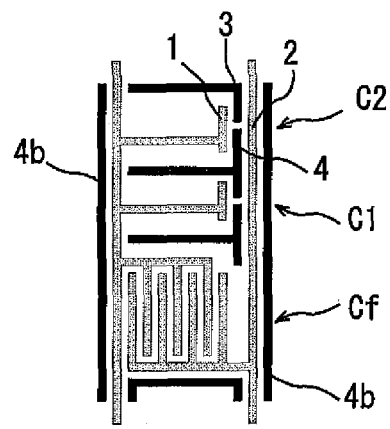
Figure 9:
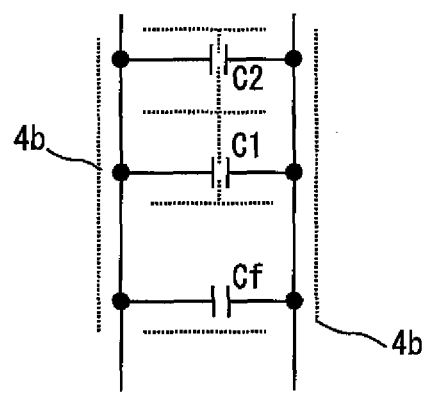
FIG. 9 is a diagram showing an equivalent electric circuit to an array of capacitors shown in FIG. 8.

Furthermore, as shown in FIG. 6, each opposite facet Sf of the first and second metal electrodes 1 and 2 may have an expanded area wider than a cross section Sc of a base portion in a direction perpendicular to the extending direction. Each of the first and second metal electrodes 1 and 2 is formed a T-shape so as to comprise a projecting portion P having the opposite facet and extending perpendicularly from a base portion B extending longitudinally. In addition, as shown in FIG. 7, only one of the first and second metal electrodes, e.g., electrode 2 may be formed to have a T-shape with an expanded area wider than a cross section Sc of a base portion in a direction perpendicular to the extending direction. There can be expected a decrease of fringing capacitance by the T-shaped metal electrode. In case that the structure described above is used, an array of capacitors as shown in FIG. 8 may be fabricated on the same insulator layer so as to include a interdigital capacitor Cf of comb-like conductor electrodes surrounded by the shield wiring 4b connected to the shield electrodes 3 and 4; and the array of the minute capacitance elements C1 and C2 of the embodiment (each having the first and second metal electrodes 1 and 2 and the shield electrodes 3 and 4). FIG. 9 shows an equivalent electric circuit to the array of FIG. 8.

In FIG. 8, the first metal electrodes 1 used for the minute capacitance elements are formed in two places. The shield electrode 4 formed between these two first metal electrodes 1 simultaneously serves the shielding ends for the two first metal electrodes 1. The shield electrode 4 shields the lower portion of the first metal electrode 1 formed at an upper of FIG. 8 and at the same time shields the upper portion of the first metal electrode 1 formed at a lower of FIG. 8. In other words, the shield electrode 4 may be arranged so as to belong to the two of the minute capacitance elements C1 and C2 at the upper and lower of FIG. 8.

In this way, in case that at least two of the minute capacitance elements C1 and C2 are formed in proximity in a row arrangement on the same insulator layer so that one of the shield electrode 4 belongs to the two of the adjacent minute capacitance elements, there is obtained an effect to suppress an increase of chip area in comparison with a chip on which the shield electrodes are provided with the first metal electrodes respectively.

As described above, there is no influence of parasitic capacitance due to the shield electrodes 3 and 4 connected to the shield wiring 4b in the configurations as shown in FIG. 8 and FIG. 9. Therefore, there is no influence from the electrode surfaces other than the opposite facets to fluctuate the capacitance, so that the minute capacitance element with a high accuracy and an array of the capacitors using the same even if the electrodes 1 and 2 are rounded by an influence of process.

—Inverting Amplifier Circuit Using Array of Minute Capacitance Elements—

There is explained the inverting amplifier circuit using the array of the minute capacitance elements having the foregoing shield electrodes 3 and 4 for gain adjustments in which a high accuracy is required.

Figure 10:
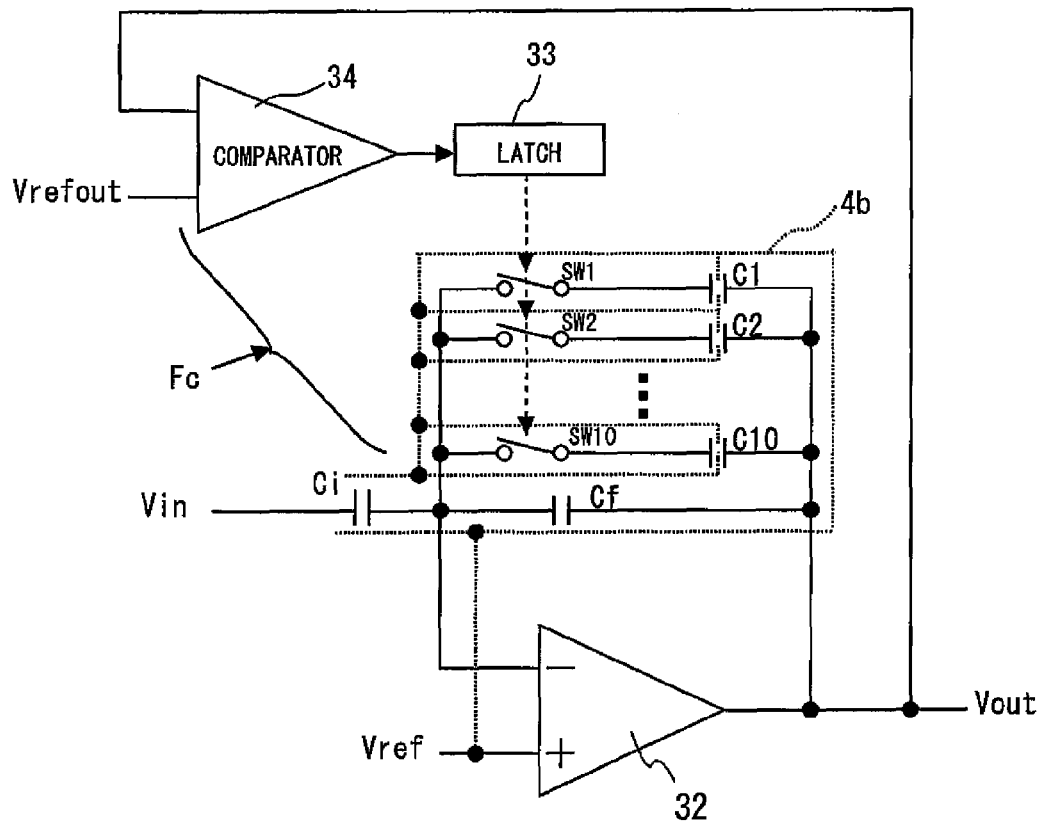
FIG. 10 is a schematic diagram showing another embodiment including an inverting amplifier circuit including a minute capacitance element according to the present invention.

FIG. 10 is a schematic diagram showing another embodiment including an inverting amplifier circuit including a storage capacitor Ci to which is an input voltage (Vin) applied as an input terminal side; an operational amplifier 32 of an output terminal side outputting a output voltage (Vout); a feedback capacitor Cf; and a feedback capacitor fine adjustment circuit Fc. Here, the array of the minute capacitance elements C1 to C10 is used as a part of the feedback capacitor fine adjustment circuit Fc for adjusting in exactly the gain of the inverting amplifier circuit.

In the inverting amplifier circuit, the storage capacitor Ci and the operational amplifier 32 are connected to each other so that the input voltage (Vin) is applied to the input terminal of the storage capacitor Ci whose output terminal is input to the negative input terminal of the operational amplifier 32.

The reference voltage (Vref) is inputted to the positive input terminal of the operational amplifier 32 (i.e., one of the positive and negative input terminals).

In addition, the feedback capacitor Cf and the operational amplifier 32 are connected to each other so that the input terminal of the feedback capacitor Cf is connected to the output terminal of the operational amplifier 32 and the output terminal of the feedback capacitor Cf is connected to the negative input terminal of the operational amplifier 32 (i.e., the other of the positive and negative input terminals).

The feedback capacitor fine adjustment circuit Fc includes, as shown in FIG. 10, on/off switches SW1 to SW10, minute capacitance elements C1 to C10 connected in series to those switches respectively; a latch circuit 33 for controlling individually the ON or OFF status of the on/off switches; and a comparator 34 for controlling the latch circuit 33. The series connection of the minute capacitance element C1 and the on/off switch SW1 is connected in parallel to the input and output terminals of the feedback capacitor Cf. Similarly the series connections of the minute capacitance elements C2 to C10 and the on/off switches SW2 to SW10 are connected in parallel to the input and output terminals of the feedback capacitor Cf respectively. The comparator 34 compares the voltage of the output terminal of the feedback capacitor Cf with output the reference voltage, and the comparator 34 is connected to the latch circuit 33 to which the comparison result output is inputted.

The feedback capacitor fine adjustment circuit Fc enables to adjust in exactly the feedback capacitance value by using the minute capacitance elements C1 to C10, even if the feedback capacitor Cf is not a desired output voltage value. Therefore, it is possible to regard the output voltage Vout of the operational amplifier 32 as a desired value. In addition, at the same time, the minute capacitance elements C1 to C10 having the shield electrodes 3 and 4 ensures a desired capacitance value of a remarkable accuracy improved over those conventionally in use, so that the feedback capacitor fine adjustment circuit Fc is capable of fine-tuning of output voltage with accuracy.

For example, assuming that the circuitry show in FIG. 10 includes the minute capacitance elements C1 to C10 each having the capacitance value of 0.05 fF, the storage capacitor Ci having the capacitance value of 1600 fF, and the feedback capacitor Cf having the capacitance value of 300 fF, in applied with the input voltage (Vin) of 1V and the reference voltage (Vref)) of 2.5V under the OFF status of the minute capacitance elements C1 to C10, then the output voltage (Vout)) is expressed according to the following computation formulas.

$$Vout=-(Vin-Vref) \times Ci/Cf+Vref$$

$$Vout=-(1-2.5) \times 1600/300+2.5=10.5V$$

Under the ON status of the minute capacitance elements C1 to C10, the output voltage (Vout) is expressed according to the following computation formulas.

$$Vout=-(Vin-Vref) \times Ci/(Cf+0.05\text{ fF} \times 10)+Vref$$

$$Vout=-(1-2.5) \times 1600/300.5+2.5=10.487V$$

Figure 11:
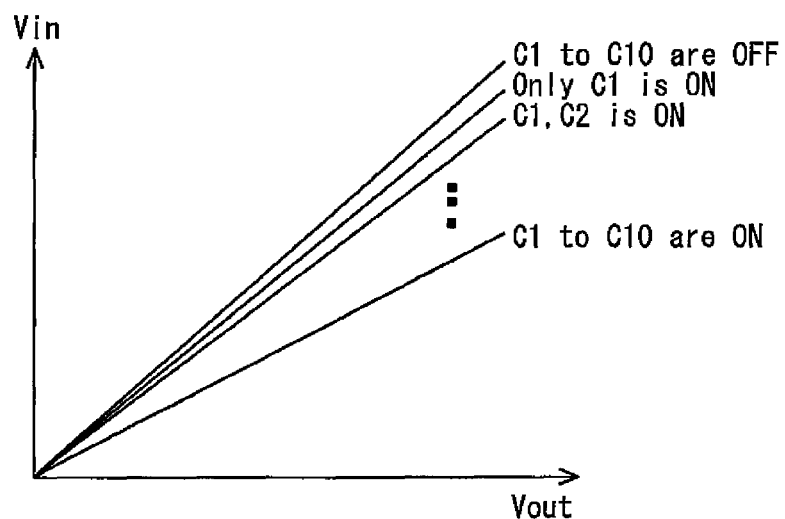
FIG. 11 is a graph showing a relationship of an input voltage (Vin) versus an output voltage (Vout) in another embodiment including an inverting amplifier circuit including a minute capacitance element according to the present invention.
Figure 1:
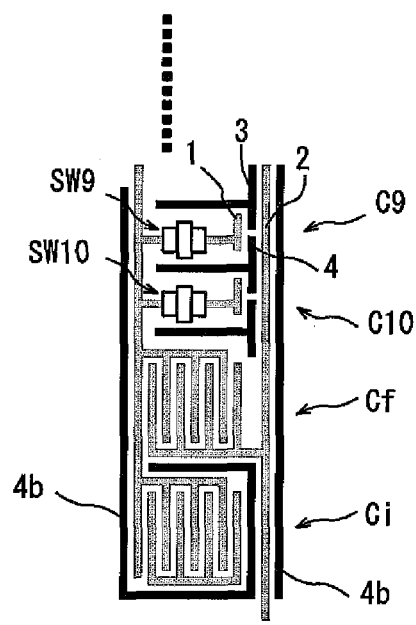
FIGS. 1A and 1B are schematic diagrams for explaining a conventional capacitance element.
Figure 1:
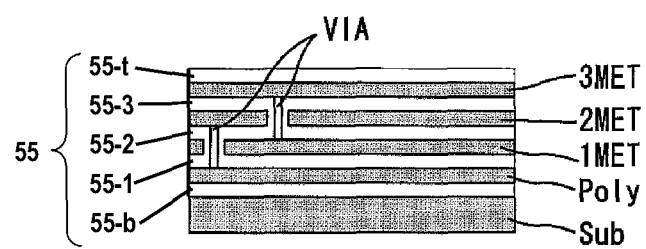

FIG. 11 shows relationships between the output voltage (Vout) and the input voltage (Vin) in the foregoing circuit. Therefore, the feedback capacitor fine adjustment circuit Fc enables to amend the voltage up to about 13 mV.

There is explained the feedback capacitor fine adjustment circuit Fc having a function of amending the output voltage as follows.

Firstly, the on/off switches SW1 to SW10 are set to an OFF status as an initialized status so that the total value of the minute capacitance elements C1 to C10 becomes zero.

Secondly, the output reference voltage (Vrefout) and the output voltage (Vout)) of the operational amplifier 32 are compared to each other. The comparison result is judged by the latch circuit 33 which makes the on/off switch SW1 work at an ON status, if Vout>Vref out.

While latching the comparison result, the latch circuit 33 sequentially repeats the comparing actuation and the ON status actuation ten times to the on/off switches SW1 to SW10. The latch circuit 33 stops actuating the on/off switches at a point in time that became Vout<Vrefout to keep the ON status of the switches.

In this way, in the feedback capacitor fine adjustment circuit Fc, the sum total of the capacitance values feed-backed of the minute capacitance elements C1 to C10 and the feedback capacitor Cf is finely adjusted, so that the output voltage Vout of the operational amplifier 32 can be set to a desired value. In other words, the feedback capacitor fine adjustment circuit Fc appropriately includes a plurality of the minute capacitance elements C1 to C10 connected in parallel to the feedback capacitor Cf and an on/off switches SW1 to SW10 for controlling individually a plurality of the minute capacitance elements to be in the ON or OFF status thereof wherein feedback capacitor Cf is connected from the output terminal of the operational amplifier 32 to the negative input terminal (i.e., the other of the positive and negative input terminals), whereby, the feedback capacitor fine adjustment circuit Fc enables to keep the output voltage Vout of the operational amplifier 32 constant with a high accuracy.

In other words, in an adjustment method for adjusting an output electrostatic capacitance value using first and second electrostatic capacitance elements, there are performed: a step of providing a first electrostatic capacitance element (Cf) and a second electrostatic capacitance element (C1 to C10) connected to the first electrostatic capacitance element, wherein the second electrostatic capacitance element has been regulated by the foregoing first adjustment method; a step of detecting an electrostatic capacitance value output by the first electrostatic capacitance element; and a step of switching the second electrostatic capacitance element to regulate an electrostatic capacitance value output by a combination of the first electrostatic capacitance element and the second electrostatic capacitance element to a predetermined value of synthetic capacitance thereof.

—Shielding Protection for the Electrode Surface of Each Minute Capacitance Element in the Inverting Amplifier Circuit—

Furthermore, there is explained by using the electric circuit shown in FIG. 10 in that the shield electrodes provided with each of the minute capacitance elements C1 to C10 performs the shielding protection for the electrode surface of each minute capacitance element.

As can be seen from computation formulas of output voltage for the foregoing circuitry, the output voltage Vout is determined by means of a ratio of difference between the reference voltage Vref and the input voltage Vin relative to the capacitance value of the capacitor Ci/(Cf+C1+ . . . +C10). Whereas, as can be seen from the circuitry shown in FIG. 10, there is a floating node between the output terminal of the capacitor Ci and the input terminal of the capacitor Cf (including the array of the minute capacitance elements C1 through C10) and thus the negative input terminal of the operational amplifier 32 is the floating node. The values Vin and Vout are fixed in potential by an external voltage or the operational amplifier. However, the electric potential between the output terminal of the capacitor Ci and the input terminal of the capacitor Cf easily fluctuates since the floating node is electrically floated about a power source. Therefore, it is preferable that the relationship between the values Vin and Vout and Vref is constant. This is because an influence to the value Vout is effectively controlled by shielding from the fringing capacitance with the value Vref to harmonize the fluctuations of Vref with the particular floating node potential, rather than, for example, by a ground shielding from the fringing capacitance to cover the electrode surface of each minute capacitance element resulting in an occurrence of instantaneous potential difference between fluctuations of the floating node and the Vref due to an influence of a ground fluctuation.

Therefore, the embodiment includes the utilization of the virtual short that the voltage difference between the positive and negative input terminals of the operational amplifier 32 (i.e., inverting amplifier circuit) is drop substantially to zero, while the floating node and each electrode of input terminals of the array of minute capacitance elements C1 through C10 are electrically floated. Consequently, since those node and electrodes and the shield wiring 4b are at the same electric potential, and any floating capacitance generated can be canceled by covering those node and electrodes with shielding metals (e.g., shield wiring 4b, shield electrodes), and further fringing capacitances between the minute capacitance element's electrodes can be canceled except the shielding slit. As a result, since the voltage Vref is applied to the shield wiring 4b that is not grounded, there is obtained an effect to hide the opposite electrodes of the minute capacitance elements other than the opposite facets thereof through the slit in the circuit layout. Although the minute capacitance element easily undergoes an influence of external noises but the shield wiring 4b of Vref can cancel the influence of noise. Thus it leads to a minute capacitance element being resistant to noises. As described above, the minute capacitance element has a minute capacitance between the electrode' s opposite facets through the slit of the shield electrodes and the shield electrodes surrounding the periphery thereof. Therefore, such a structure makes it hard to see unnecessary capacitances such as fringing capacitance or the like, so that the precise minute capacitance value of the element is defined by only the slit width.

—Shielding Structure—

The HDLCD driver or the like is commonly fabricated to have a multilayer structure LSI. Thus, the exemplary layout of multilayer structure having shield electrodes will be described hereinafter.

The feedback capacitor fine adjustment circuit Fc, and the capacitor array of the storage capacitor Ci, the feedback capacitor Cf etc. in the electric circuit shown in FIG. 10 are formed in a single layer.

FIG. 12 is a schematic partial plane view showing a portion of the capacitor array of the electric circuit shown in FIG. 10. FIG. 12 shows on/off switches SW9, SW10 within the on/off switches SW1 to SW1, elements C9, C10 of the minute capacitance elements C1 to C10, the storage capacitor Ci, and the feedback capacitor Cf. Each minute capacitance element C9, C10 has shield electrodes 3 and 4 defining a slit disposed between the first and second metal electrodes 1 and 2. The shield wirings 4b surround the on/off switches SW9, SW10, the minute capacitance element C9, C10, the storage capacitor Ci, and the feedback capacitor Cf which are shielded on the same insulator layer.

FIG. 13 is a schematic partial cross section view showing a layout including the electric circuit shown in FIG. 12. This illustrates a five-layer structure including a Si substrate Sub for a semiconductor device. There are layered on the substrate Sub to be grounded, a polysilicon pattern layer Poly as a first Vref shield layer (first shield layer), a layout layer 1MET including the capacitor array of the electric circuit shown in FIG. 12, a second Vref shield layer 2MET (second shield layer), and a signal wiring layer 3MET, which are sandwiched by insulator layers 55 one after the other. In other words, the minute capacitance element comprises, as shown in FIG. 13, the Si substrate (Sub); a bottom insulator layer (55-b); the first Vref shield layer (Poly); a first insulator layer (55-1); the layout layer (1MET); a second insulator layer (55-2); the second Vref shield layer (2MET); a third insulator layer (55-3); the signal wiring layer (3MET); and a top insulator layer (55-t).

A penetrating conductor (VIA) interconnects only the portion of the signal wiring layer 3MET and the portion of the capacitor array layout layer 1MET to be connected to each other through a hole bored in the second Vref shield layer 2MET. Various control signal lines including a wiring led from a decoder or the like are wired in the signal wiring layer 3MET. The portion of the capacitor array layout layer 1MET is shielded with the Vref voltage by the second Vref shield layer 2MET and the polysilicon pattern layer Poly (i.e., first Vref shield layer) which are connected to each other through the VIA so as to prevent from influences of the foregoing control signal and an electric potential fluctuation of the substrate Sub. As described above, the embodiment performs the Vref voltage shielding of the portion of the capacitor array layout layer 1MET not only on the same insulator layer but also by the adjacent insulator layers (55-1 and 55-2), so that the layout structure of minute capacitance element being extremely resistant to noises can be achieved.

—Embodiment of HDLCD Driver—

The inverting amplifier circuit including the operational amplifier 32, the feedback capacitor Cf, and the feedback capacitor fine adjustment circuit Fc or the like shown in FIG. 10 can be utilized for a HDLCD driver.

Figure 14:
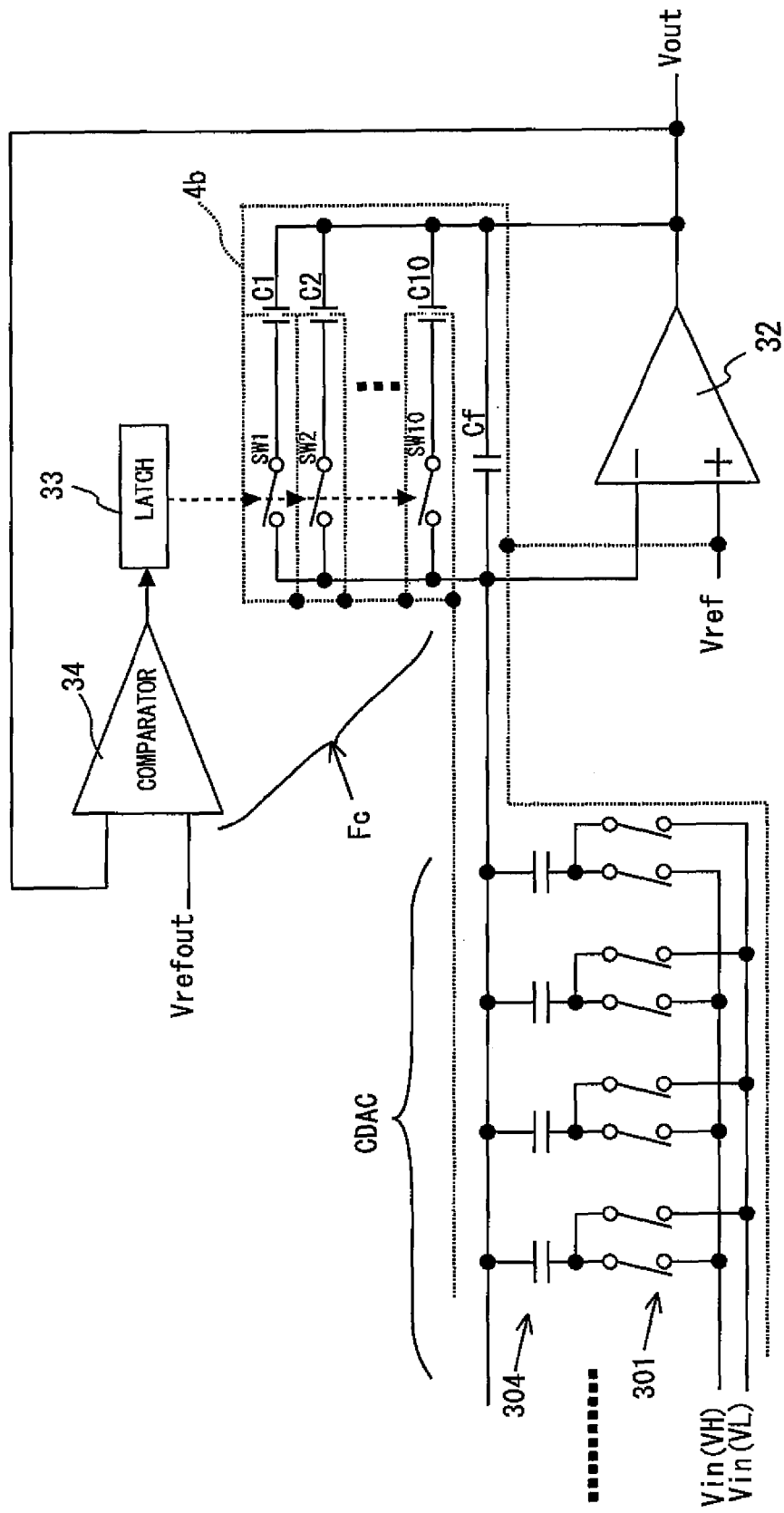
FIG. 14 is a schematic circuit diagram showing a HDLCD driver of another embodiment including a minute capacitance element according to the present invention.

FIG. 14 is a schematic circuit diagram showing such a HDLCD driver. This HDLCD driver is comprised as the same as the inverting amplifier circuit shown in FIG. 10 except that a capacitive DAC (CDAC) shielded with the Vref voltage is used for storage capacitor a instead of the storage capacitor Ci of FIG. 10. Thus, the capacitive DAC, aside from elements same as reference mark shown in FIG. 10, is explained mainly.

The capacitive DAC (CDAC) comprises, as shown in FIG. 14, a capacitor group 304 consisting of the capacitors each having the same capacitance value and connected in parallel for an input storage; and a change over switch group 301 consisting of switches connected in series to the said capacitors respectively and providing an individual input voltage Vin (VH, VL). When the input voltage Vin (VH, VL) is applied to the input terminal of the change over switch group 301 according to a predetermined timing signal, then a high or low voltage level (VH, VL) line is selected by the change over switch 301 at the input terminal side according to a control signal provided from another control circuit (not shown), after that the selected voltage is output to the input terminal of one capacitor of the capacitor group 304, so that the signals to be displayed are D/A converted to be subdivided into a gray scale voltage, the total output of the capacitor group 304 of the capacitive DAC is input to the negative input terminal of the operational amplifier 32. A voltage of 16/3 times intermediate voltage multiplied by the number of the VH/VL lines connected to the capacitive DAC is output from the capacitance DAC.

Figure 15:
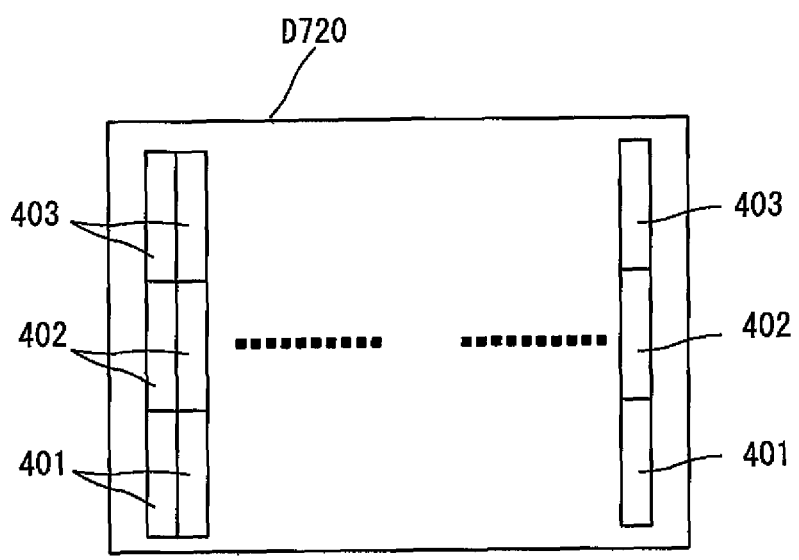
FIG. 15 is a schematic partial plane view showing a 720ch-driver of a HDLCD driver of another embodiment including a minute capacitance element according to the present invention.

FIG. 15 is a schematic partial plane view showing a 720ch-driver of a HDLCD driver D720 which has strips of circuitry layout regions 401, 402, 403 disposed linearly and being respectively a decoder section 401 including a control part such as a decoder or the like controlling the input terminal change over switches; a capacitor array 402 of the capacitive DAC (CDAC); an amplifier section 403 including an operational amplifier as described above. The HDLCD driver D720 is composed of 720 layout region strips arranged in parallel and capable of outputting 720 channel-outputs wherein one of the layout region strips corresponds to one channel.

Figure 16:
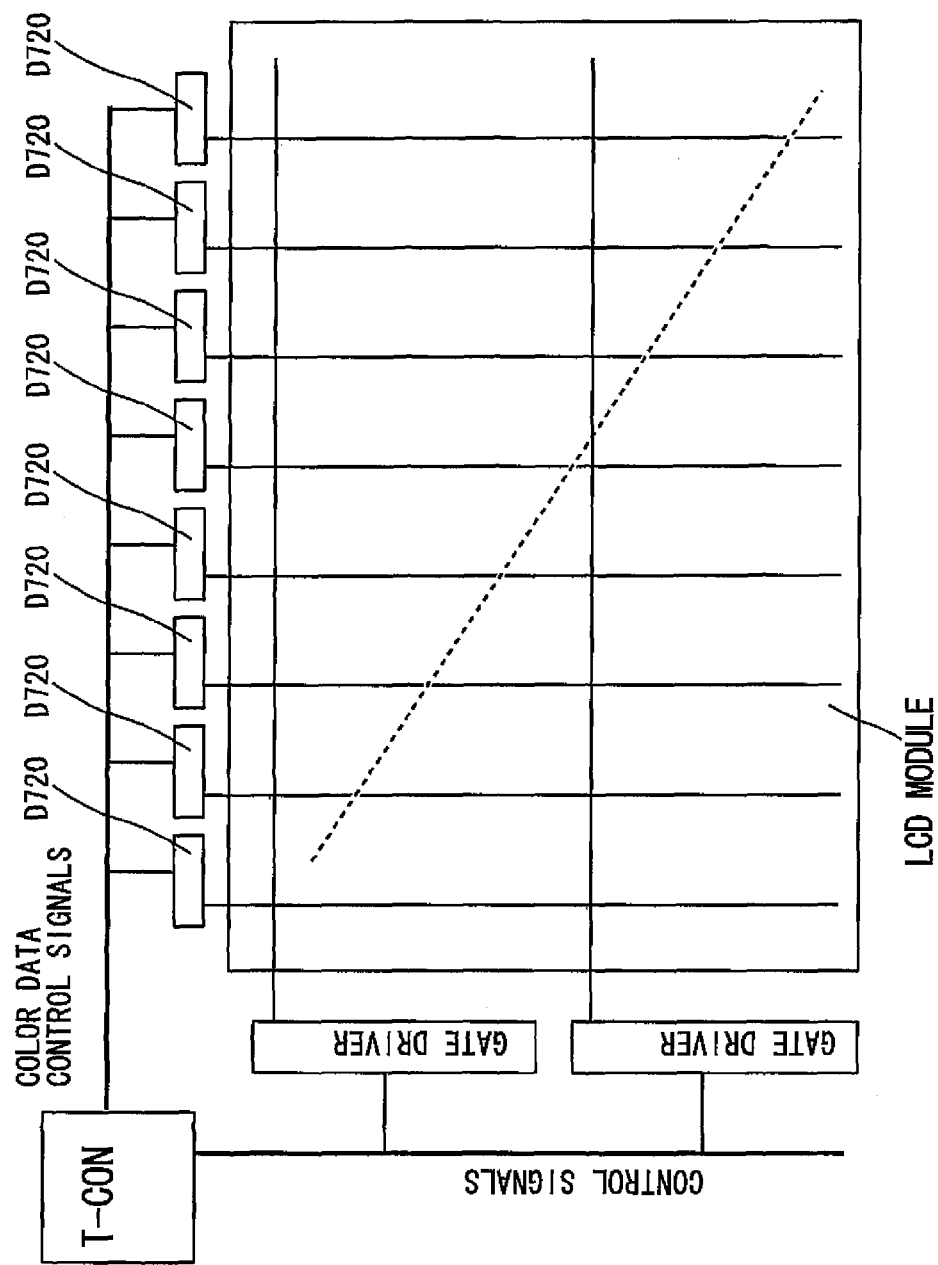
FIG. 16 is a schematic diagram showing a LCD panel configuration using 720ch-drivers of HDLCD drivers of another embodiment including a minute capacitance element according to the present invention.

FIG. 16 is a schematic diagram showing a LCD panel configuration using the 720ch-drivers of HDLCD drivers D720 in which vertically oriented gate drivers (an amounted to 1080 channels) are used and eight pieces of the 720th HDLCD drivers D720 are used as source drivers (an amounted to 5760 channels (1920×RGB) in the horizontal direction). In the LCD panel, image data is transferred from a timing controller T-CON to the gate drivers and source drivers in which each driver converts the image data to a voltage level per one channel and then output it the LCD panel.

Therefore, the present invention provide a liquid crystal display driving device; an adjustment method for adjusting an output electrostatic capacitance value output from an electrostatic capacitance element; and an adjustment method for adjusting an output electrostatic capacitance value by using first and second electrostatic capacitance elements.

According to the present invention, there is provided a liquid crystal display driving device including a capacitive DAC having an array of capacitance elements, an operational amplifier and minute capacitance elements, the liquid crystal display driving device comprising:

a minute capacitance element including an insulator layer; a pair of first and second metal electrodes having respective opposite facets facing each other formed on the insulator layer to define a first gap therebetween; and a shield electrode being connectable to an externally applied potential and formed on the insulator layer within the first gap to define a slit confining a synthetic capacitance;

an operational amplifier having positive and negative input terminals in a virtual short wherein a reference voltage to be input to one of the positive and negative input terminals is applied to the shield electrode;

a feedback capacitor connected from the output terminal of the operational amplifier to the other of the positive and negative input terminals, wherein a plurality of the minute capacitance elements are connected in parallel to the feedback capacitor;

a switching device for controlling individually a plurality of the minute capacitance elements to be in an ON or OFF status thereof;

a capacitive DAC connected to the operational amplifier so that the output of the capacitive DAC is input to the other of the positive and negative input terminals of the operational amplifier;

a first shield layer to which the reference voltage is applied and layered under the insulator layer;

a second insulator layer formed on the first and second metal electrodes and the shield electrode; and a second shield layer to which the reference voltage is applied and covering the first and second metal electrodes and the shield electrode via the second insulator layer.

Further, according to the present invention, there is provided a first adjustment method for adjusting an output electrostatic capacitance value output from an electrostatic capacitance element including: a pair of first and second metal electrodes formed on an insulator layer so as to be spaced out and facing each other to define a capacitance therebetween; and a pair of shield electrodes connected to a power source and formed between the first and second metal electrodes on the insulator layer so as to be spaced out and facing each other, the first adjustment method comprising the steps of:

setting an electrostatic capacitance between the first electrode and the second electrode; and adjusting a distance between the pair of shield electrodes, whereby a capacitance value defined between the first electrode and the second electrode is regulated.

Still further, according to the present invention, there is provided a second adjustment method for adjusting an output electrostatic capacitance value by using first and second electrostatic capacitance elements, the second adjustment method comprising the steps of:

providing a first electrostatic capacitance element and a second electrostatic capacitance element connected to the first electrostatic capacitance element, wherein the second electrostatic capacitance element has been regulated by the foregoing first adjustment method;

detecting an electrostatic capacitance value output by the first electrostatic capacitance element; and switching the second electrostatic capacitance element to regulate an electrostatic capacitance value output by a combination of the first electrostatic capacitance element and the second electrostatic capacitance element to a predetermined value of synthetic capacitance thereof.

It is understood that the foregoing description and accompanying drawings set forth the preferred embodiments of the invention at the present time. Various modifications, additions and alternative designs will, of course, become apparent to those skilled in the art in light of the foregoing teachings without departing from the spirit and scope of the disclosed invention. Thus, it should be appreciated that the invention is not limited to the disclosed embodiments but may be practiced within the full scope of the appended claims.

This application is based upon and claims the benefit of priority from the prior Japanese Patent Application No. 2009-290705, filed Dec. 12, 2009, the entire contents of which are incorporated herein by reference.

What is claimed is:

1. A minute capacitance element comprising:
a semiconductor substrate;
an insulator layer formed on the semiconductor substrate;
a pair of first and second metal electrodes having respective opposite facets facing each other formed on the insulator layer to define a first gap therebetween;
a shield electrode being formed on the insulator layer within the first gap to define a slit confining a synthetic capacitance; and
wherein the shield electrode is externally connected for being applied with an external potential.

2. The minute capacitance element according to claim 1, further comprising: a first shield layer layered under the insulator layer; a second insulator layer formed on the first and second metal electrodes and the shield electrode; and a second shield layer covering the first and second metal electrodes and the shield electrode via the second insulator layer.

3. The minute capacitance element according to claim 1, wherein at least one of the first and second metal electrodes comprises a projecting portion having the opposite facet and extending perpendicularly from a base portion extending longitudinally so that the opposite facet has an expanded area wider than a cross section of the base portion in the perpendicular direction.

4. The minute capacitance element according to claim 1, wherein the opposite facets of the first and second metal electrodes are rounded.

5. The minute capacitance element according to claim 1, wherein two of the minute capacitance elements are provided in proximity in a row arrangement so that one of the shield electrodes belongs to the two of the minute capacitance elements.

6. The minute capacitance element according to claim 1, further comprising a shield wiring connected to the shield electrode to apply the external potential thereto.

7. The minute capacitance element according to claim 1, wherein the shield electrode is interposed between the pair of first and second metal electrodes from outside of both ends of the first and second metal electrodes into the first gap defined therebetween.

8. A semiconductor device comprising:
a minute capacitance element including an insulator layer;
a pair of first and second metal electrodes having respective opposite facets facing each other formed on the insulator layer to define a first gap therebetween; and a shield electrode being connectable to an externally applied potential and formed on the insulator layer within the first gap to define a slit confining a synthetic capacitance; and an operational amplifier having positive and negative input terminals in a virtual short wherein a reference voltage to be input to one of the positive and negative input terminals is applied to the shield electrode.

9. The semiconductor device according to claim 8, further comprising: a first shield layer to which the reference voltage is applied and layered under the insulator layer; a second insulator layer formed on the first and second metal electrodes and the shield electrode; and a second shield layer to which the reference voltage is applied and covering the first and second metal electrodes and the shield electrode via the second insulator layer.

10. The semiconductor device according to claim 8, wherein at least one of the first and second metal electrodes comprises a projecting portion having the opposite facet and extending perpendicularly from a base portion extending longitudinally so that the opposite facet has an expanded area wider than a cross section of the base portion in the perpendicular direction.

11. The semiconductor device according to claim 8, further comprising:
a feedback capacitor connected from the output terminal of the operational amplifier to the other of the positive and negative input terminals, wherein a plurality of the minute capacitance elements are connected in parallel to the feedback capacitor; and
a switching device for controlling individually a plurality of the minute capacitance elements to be in an ON or OFF status thereof.

12. The semiconductor device according to claim 8, wherein the shield electrode is interposed between the pair of first and second metal electrodes from outside of both ends of the first and second metal electrodes into the first gap defined therebetween.

13. The semiconductor device according to claim 8, wherein the shield electrode is formed apart from the pair of first and second metal electrodes.

14. An electrostatic capacitance element comprising:
a semiconductor substrate;
an insulator layer formed on the semiconductor substrate;
a pair of first and second metal electrodes formed on the insulator layer so as to be spaced out and facing each other to define a capacitance therebetween; and
a pair of shield electrodes connected to a power source and formed between the first and second metal electrodes on the insulator layer so as to be spaced out and facing each other.

15. The electrostatic capacitance element according to claim 14, wherein the first electrode has a first opposite portion formed at a leading end of the first electrode opposite to the second electrode so as to be electrically connected to the first electrode and extending perpendicularly from the first electrode extending longitudinally.

16. The electrostatic capacitance element according to claim 15, wherein the second electrode has a second opposite portion formed at a leading end of the second electrode opposite to the first opposite portion of the first electrode so as to be electrically connected to the second electrode and extending perpendicularly from the second electrode extending longitudinally.

17. The electrostatic capacitance element according to claim 14, further comprising shield wirings connected to the shield electrodes and the power source.

18. The electrostatic capacitance element according to claim 14, wherein the shield electrode is interposed between the pair of first and second metal electrodes from outside of both ends of the first and second metal electrodes into the first gap defined therebetween.

* * * * *